United States Patent [19]
Tamegaya

[11] Patent Number: 5,629,877
[45] Date of Patent: May 13, 1997

[54] PROCESS AND DEVICE COMPOSITE SIMULATION SYSTEM AND SIMULATION METHOD

[75] Inventor: Yukio Tamegaya, Tokyo, Japan

[73] Assignee: NEC Corporation, Tokyo, Japan

[21] Appl. No.: 264,350

[22] Filed: Jun. 23, 1994

[30] Foreign Application Priority Data

Jun. 24, 1993 [JP] Japan .................... 5-152553

[51] Int. Cl.⁶ .................................................. G06F 17/50
[52] U.S. Cl. .................. 364/578; 364/488; 364/489; 395/500
[58] Field of Search .................... 364/488, 489, 364/491, 578; 324/565, 768; 395/500

[56] References Cited

U.S. PATENT DOCUMENTS

| | | | |
|---|---|---|---|
| 4,766,429 | 8/1988 | Stapleton | 340/724 |
| 4,791,593 | 12/1988 | Hennion | 364/578 |
| 4,815,024 | 3/1989 | Lewis | 364/802 |
| 4,858,146 | 8/1989 | Shebini | 364/512 |
| 4,939,681 | 7/1990 | Yokomizo et al. | 364/578 |
| 4,969,116 | 11/1990 | Wada et al. | 364/578 |
| 5,050,091 | 9/1991 | Rubin | 364/488 |
| 5,070,469 | 12/1991 | Kunikiyo et al. | 364/488 |
| 5,103,415 | 4/1992 | Omura et al. | 364/578 |
| 5,237,513 | 8/1993 | Kaplan | 364/490 |
| 5,289,384 | 2/1994 | Akiyama | 364/578 |
| 5,313,398 | 5/1994 | Rohrer et al. | 364/468 |
| 5,345,401 | 9/1994 | Tani | 364/578 |

OTHER PUBLICATIONS

K. R. Krieg et al., "ASIM, An Efficient Simulation Environment for Cellular Neural Networks and Analog Arrays", V. C. Berkeley.

Rafferty et al., "Iterative Methods in Semiconductor Device Simulation," IEEE Trans, Electr. Devices, pp. 2018–2027, Oct. 1985.

Sudarshan et al., "Computational Analysis of the Surface Permittivity and Charging of Dielectrics with the SEM-Mirror Techniques," IEEE, 1992, pp. 1127–1135.

*Primary Examiner*—Kevin J. Teska
*Assistant Examiner*—Thai Phan
*Attorney, Agent, or Firm*—Foley & Lardner

[57] ABSTRACT

A unified process and device simulation system unitarily performs simulation for a process design and a device design of a semiconductor device. The system includes a process simulator which performs a process simulation for one of a pair of regions of the semiconductor device. The regions are symmetric in configuration and structure about a center line which extends perpendicular to a direction about which the simulation is carried out. The process simulator generates a first simulation data. The system also includes a mirror reversal processing portion for performing a mirror reversing process for establishing a mirror data of the first simulation data symmetric about the center line on the basis of structure data of the semiconductor and connecting the mirror data to the first simulation data at the center line in order to generate a second data equivalent to a process simulation data obtained through the process simulation for an entire region of the semiconductor device. A device simulator then performs a device simulation with respect to the second data on the basis of a predetermined analysis condition.

12 Claims, 10 Drawing Sheets

PROCESS AND DEVICE COMPOSITE SIMULATION SYSTEM AND SIMULATION METHOD

BACKGROUND OF THE INVENTION

1. Field of the Invention

The present invention relates generally to a simulation system for a semiconductor device utilizing a computer aided design (CAD). More specifically, the invention relates to a unified process and device simulation system and a simulation method for unitarily performing a process simulation and a device simulation.

2. Description of the Related Art

A most important problem in development of a very large scale integrated circuit (VLSI) element is how to achieve high precision and high efficiency in process and device design. Corresponding to a trend to higher integration density and greater scale, it is becoming essential to introduce a simulation technology employing an electronic computer in a stage of process designing and device designing. As means for performing the simulation, a unified process and device simulation system (hereinafter referred to as "simulator") for process device unitary designing, which unitarily sets process condition of the process designing and the device designing in view of a targeted feature of a final element, has been widely employed. In the recent years, corresponding to down-sizing in the order of sub-micron associating with further higher integration density of the integration circuit, higher precision modeling has been required in simulation. In order to satisfy such requirement, there have been proposed various so-called second-generation unified process and device simulators.

As one example of such type of unified process and device simulators, a simulator proposed in Matsuo et al. "A SUPERVISED PROCESS AND DEVICE SIMULATION FOR STATISTICAL VLSI DESIGN" in "INTERNATIONAL WORKSHOP ON NUMERICAL MODELING OF PROCESS AND DEVICES FOR INTEGRATED CIRCUIT", 1990, pages 59–60 of proceeding of NUPAD 3, employs a two dimensional process simulator, a two-dimensional device simulator and a system control unit called as a supervisor which interprets input data and generates an input parameter through modification of standard data in a library, in place of a simple analysis model or a linear numerical model. In the literature, there has been reported that when the simulator is applied for designing of MOSFET according to 8 µm rule, simulation could be done at higher precision with one fourth of simulation period in comparison with the case where the simple analysis model or the linear numerical model.

A simulation method by the above-mentioned conventional process and device composite simulator for simulating variation of electric characteristic of MOSFET with selecting 1 µm, 2 µm and 3 µm as parameter will be discussed with reference to a flowchart in FIG. 15.

Initially, the process simulation is performed employing a process data and a mask data for ion implantation, deposition, oxidation, diffusion, etching and so forth per every predetermined step length (e.g. 1/100 of the overall length) of a MOSFET corresponding to a channel length of 1 µm (hereinafter referred to as "objective device" (step 1501), by the process simulator. Then, by means of the device simulator, a device simulation was performed in terms of analysis condition of the result of the process simulation and analysis condition, such as bias and so forth (step 1502). Similarly, corresponding to the channel length of 2 µm and 3 µm, the operation of the steps 1501 and 1502 are repeatedly executed. Then, when simulations corresponding to designated three types of channels are all completed, overall simulation is terminated (step 1503).

An example section of the device obtained from the above-mentioned conventional simulation method is shown in FIG. 16.

Namely, by performing the process simulation for the objective device, mesh 200 defining segment blocks to perform simulation as shown in FIG. 16 on the section of the device are set and impurity distribution is calculated on the basis of data for respective segment blocks.

On the other hand, utilizing the result of the process simulation, the device simulation is performed. Then, from the obtained result of process and device composite simulation, the electric characteristic of the MOSFET as the objective device can be obtained (see FIG. 17).

When channel length depending characteristic of the MOSFET is simulated, for example, the process simulation and device simulation have to be repeated for overall length of the MOSFET per every predetermined step length over cycles corresponding to number of variation of the channel lengths. In the above-mentioned example, when a computer having an operation speed of 30 MIPS (million instructions per second) is employed, a required period for the process simulation for one cycle (one channel length) becomes approximately 15 minutes, and a required period for the device simulation for one cycle becomes approximately 18 minutes. In the foregoing example, since the process simulation and the device simulation have to be repeated for three times for three distinct channel lengths, necessary operation period for completing overall simulation becomes approximately 99 minutes.

As set forth above, the above-mentioned conventional simulation method encounters a problem of requiring long period for completing overall simulations as the process simulation and device simulation have to be repeated for overall length of the MOSFET per every predetermined step length over cycles corresponding to number of variation of the channel lengths.

SUMMARY OF THE INVENTION

Therefore, it is a first object of the present invention to provide a simulation method which can shorten a period required for completing overall simulations in a simulation employing a unified process and device simulator.

A second object of the present invention is to provide a simulation method which can further shorten the overall process period according to increasing number of terms of the set values of the parameter in addition to the task set out in the first object.

According to one aspect of the invention, a unified process and device simulation system unitarily performing simulation for a process designing and a device designing of a semiconductor device, comprises:

a process simulator performing a process simulation for one of a pair of regions of the semiconductor device, which regions are symmetric in configuration and structure about a center line extending perpendicularly to a direction to progress the simulation, and generating a first simulation data;

mirror reversal processing means for performing a mirror reversing process for establishing a mirror data of the first simulation data symmetric about the center line on the basis of the structure data of the semiconductor and connecting the mirror data to the first simulation data at the center line in order to generate a second data equivalent to a process simulation data obtained through the process simulation for overall region of the semiconductor device; and a device simulator for performing a device simulation with respect to the second data on the basis of a predetermined analysis condition.

In the preferred process, the mirror reversal processing means performs reversing process by copying the first simulation data to a memory region for data processing and reversing the order of the copied first simulation data for establishing the mirror data and generates the second data by coupling the mirror data to the first simulation data at the center line.

The unified process and device simulation system may further comprise extension data adding means for generating an extension data by extending the simulation data as the first simulation data for a given length and adding the extension data between the first simulation data and the mirror data. In such case, the extension data adding means may generate the extension data by extending the simulation data corresponding to the center line of the semiconductor device for the predetermined length.

In the alternative, the unified process and device simulation system may further comprise extension data adding means for generating an extension data by extending the simulation data as the first simulation data for a given length, and adding the extension data to the first simulation data, and, the mirror reversal processing means generates the second data by mirror reversing the first simulation data and the extension data with taking the end of the extension data as the center line.

The unified process and device simulation system may further comprise data cutting off means for cutting off a predetermined length of the simulation data as the first simulation data from the center line, and the mirror reversal processing means generates the second data by connecting the first simulation data from which the predetermined length is cut off and the mirror data.

Alternatively, the unified process and device simulation system may further comprise data cutting off means for cutting off a predetermined length of the simulation data as the first simulation data from the center line, and the mirror reversal processing means establish the mirror data with respect to the first simulation data from which the predetermined length is cut off.

According to the second aspect of the invention, a method for performing unified process and device simulation for unitarily performing simulation for a process designing and a device designing of a semiconductor device by an electronic computer, comprises the steps of:

a step of performing a process simulation for one of a pair of regions of the semiconductor device, which regions are symmetric in configuration and structure about a center line extending perpendicularly to a direction to progress the simulation, and generating a first simulation data;

a step of performing a mirror reversing process for establishing a mirror data of the first simulation data symmetric about the center line and connecting the mirror data to the first simulation data at the center line in order to generate a second data equivalent to a process simulation data obtained through the process simulation for overall region of the semiconductor device; and a step of performing a device simulation with respect to the second data on the basis of a predetermined analysis condition.

The mirror reversal process may be performs by copying the first simulation data to a memory region for data processing and reversing the order of the copied first simulation data for establishing the mirror data and generates the second data by coupling the mirror data to the first simulation data at the center line.

The simulation method may further comprise an extension data adding step of generating an extension data by extending the simulation data as the first simulation data for a given length and adding the extension data between the first simulation data and the mirror data. In this case, the extension data adding step may generate the extension data by extending the simulation data corresponding to the center line of the semiconductor device for the predetermined length.

The simulation method may further comprise extension data adding step of generating an extension data by extending the simulation data as the first simulation data for a given length and adding the extension data to the first simulation data, and the second data is generated in the step of performing the mirror reversing process by mirror reversing the first simulation data and the extension data with taking the end of the extension data as the center line.

Alternatively, the simulation method may further comprise a data cutting off step of cutting off a predetermined length of the simulation data as the first simulation data from the center line, and the second data is generated in the step of performing the mirror reversing process by connecting the first simulation data from which the predetermined length is cut off and the mirror data.

In the further alternative, the simulation method further comprise a data cutting off step of cutting off a predetermined length of the simulation data as the first simulation data from the center line, and the second data is generated in the step of performing the mirror reversing process by mirror reversing the first simulation data from which the predetermined length is cut off with taking the end of the cut end as the center line.

Other objects, advantages and effects of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order not to unnecessarily obscure the present invention.

At first, it should be noted that a simulation method according to the present invention is applicable for MOSFET and so forth which have sections (drawings as subject for simulation) with configurations symmetric with respect to center lines intersecting perpendicularly to directions to progress the simulation. Also, it is assumed that operations, such as ion implantation and so forth in fabricating process of a objective device is performed without causing local concentration. Furthermore, it should be noted that the only mesh intersecting perpendicularly is employed in a process simulation, and other meshes, such as triangular mesh and so forth will not be employed.

One embodiment of a unified process and device simulator according to the present invention will be discussed with reference to FIG. 1.

Figure 1:
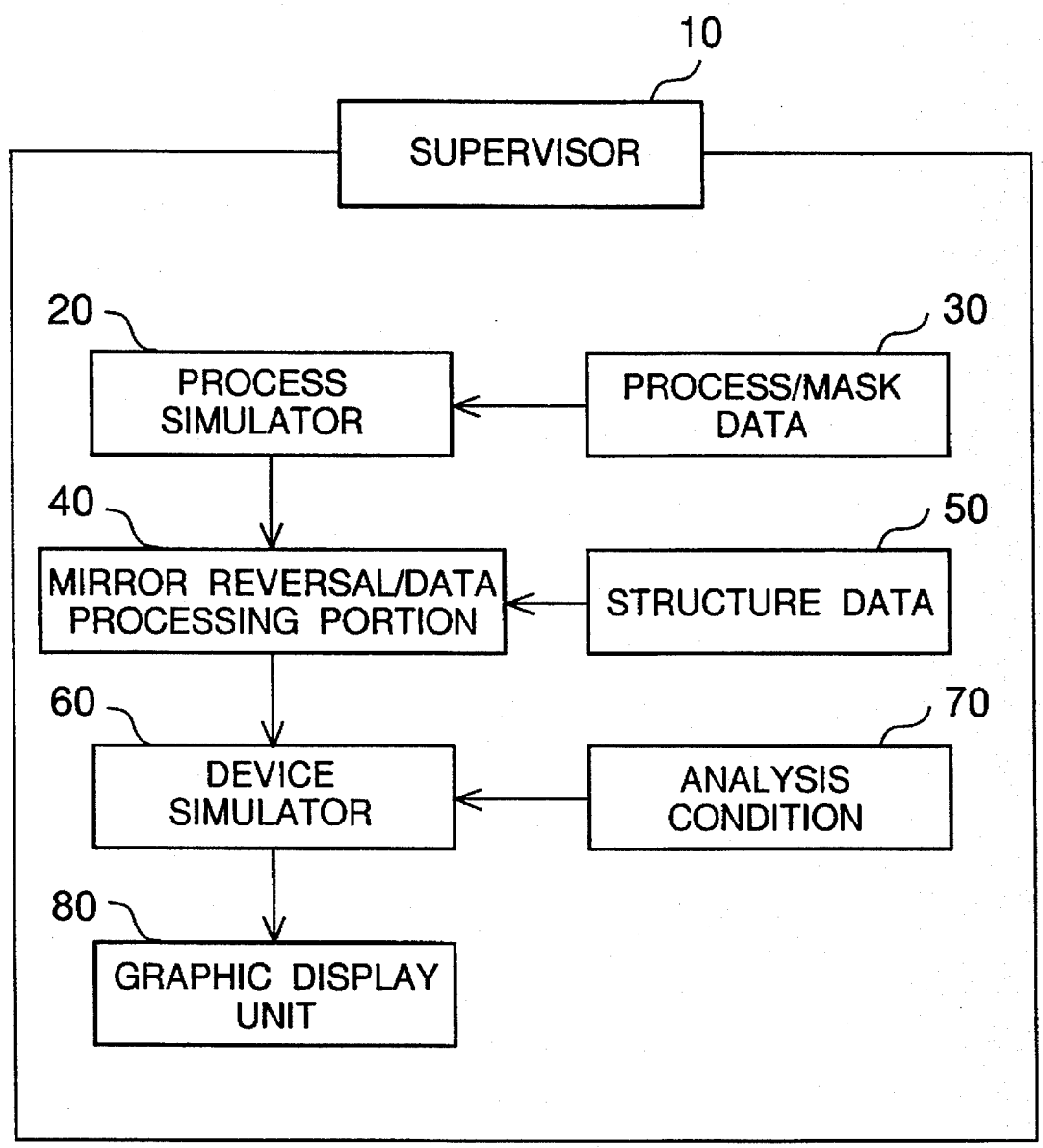
FIG. 1 is a block diagram showing one embodiment of a unified process and device simulator according to the present invention.

As shown in FIG. 1, the shown embodiment of the unified process and device simulator has a supervisor 10 which unitarily manages overall operation of the system, a process simulator 20 which performs a process simulation, a mirror reversal/data processing portion 40 which performs data processing for the result of the process simulation, a device simulator 60 for performing a device simulation and a graphic display unit 80 for displaying the result of simulation.

The supervisor 10 unitarily controls sequence of process of the overall system. The supervisor further operates to automatically perform small process, such as modification of values of an objective parameter of the objective device upon mirror reversal by the mirror reversal/data processing portion 40.

The process simulator 20 is a two-dimensional process simulator similar to that discussed with respect to the prior art and performs the process simulation on the basis of process/mask data 30, such as ion implantation, deposition, oxidation, diffusion, etching and so forth, with respect to the objective device.

The mirror reversal/data processing portion 40 receives supply of a structure data 50 of the objective device and performs a mirror reversing process for reversing the result of the process simulation by the process simulator 20 about the center line of the section of the objective device to generate a reversed data which represents a section symmetric to the result of the process simulation about the center line. The mirror reversal/data processing portion 40 also performs an extension data adding process for adding an extension data to the center line portion of the result of process simulation and a data cut-off process for cutting off the data of the process simulation in the vicinity of the center line of the device section. The mirror reversing process is performed by writing the data indicative of the result of the process simulation in a memory region for data processing in the reversed order. On the other hand, the extension data adding process is performed by simply adding the extension data without modifying the resultant data of the process simulation. The data cut-off process is performed by cutting off a predetermined amount of data in the direction from the center line to the end in the device section. These data processing is performed with reference to a structure data 50 including the storage position of the result of the mirror reversing process, an extension unit for the extension data, an amount for addition and so forth.

The device simulator 60 is also the similar two-dimensional device simulator to the prior art. The device simulator 60 receives the result of the data processing by the mirror reversal/data processing portion 40. Also, the device simulator 60 receives a analysis condition 70 which includes voltages, currents, carrier density, threshold voltages, current amplification rate and so forth at a steady state and a transition state obtained by applying a bias for respective electrodes to perform the device simulation.

Figure 2:
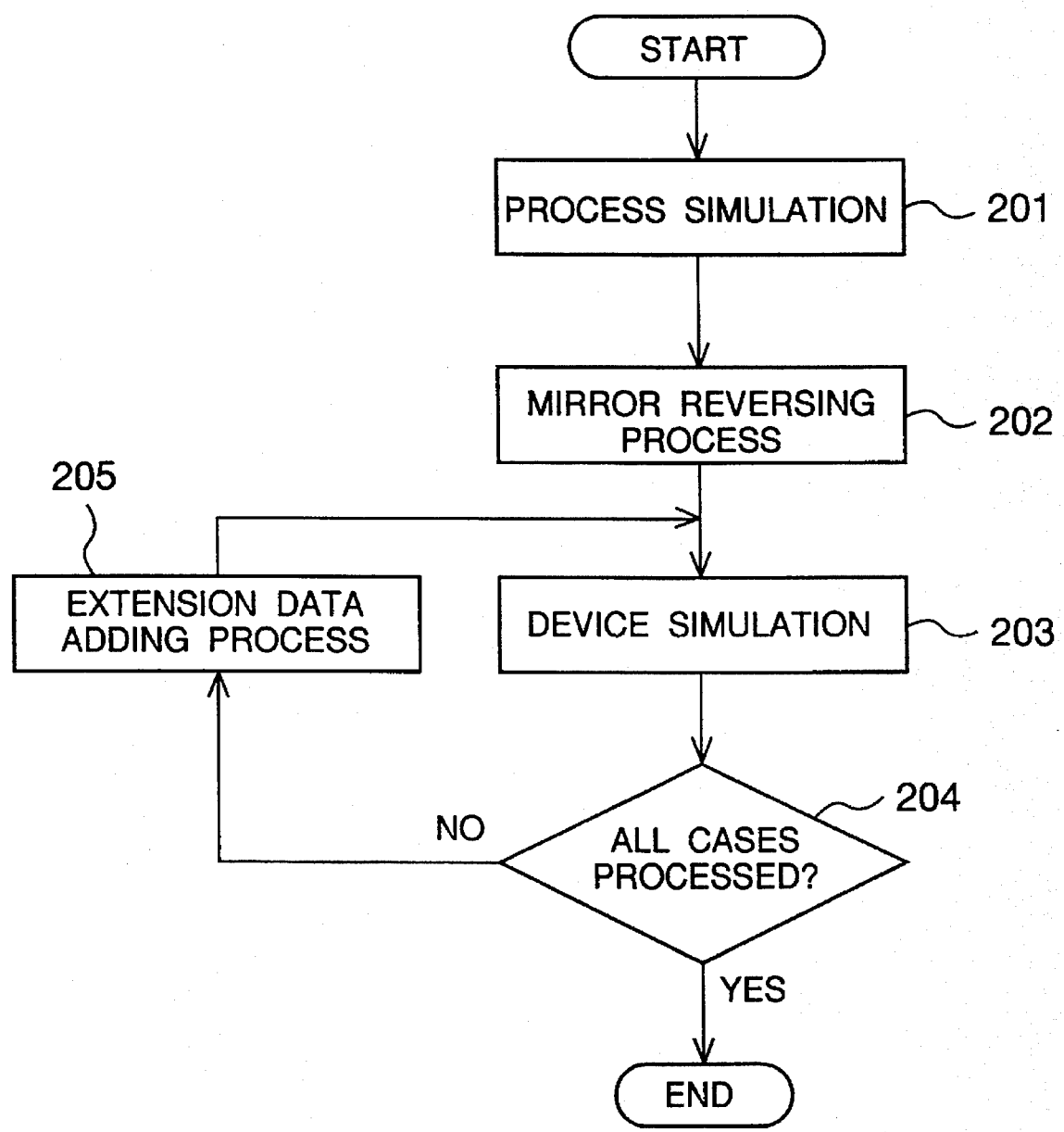
FIG. 2 is a flowchart showing a first embodiment of a simulation method to be implemented by the shown embodiment of the unified process and device simulator.
Figure 5:
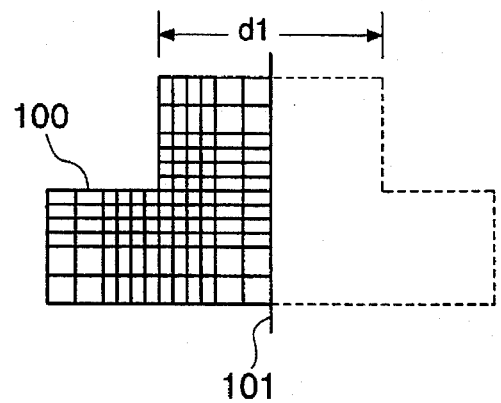
FIG. 5 is a sectional view showing a section of the device representative of the result of simulation according to the first embodiment of the simulation, which section shows the result of simulation for half of the device section.
Figure 6:
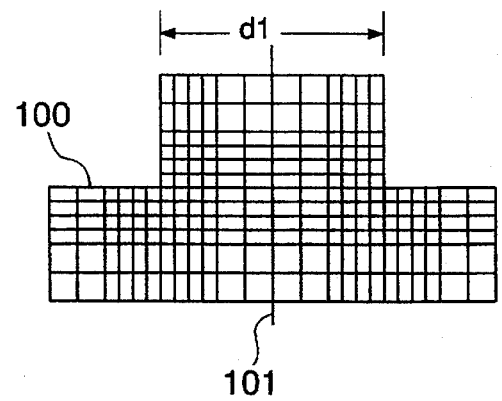
FIG. 6 is an illustration showing a condition where the result of the simulation in FIG. 5 is reversed in mirror fashion and composed.
Figure 7:
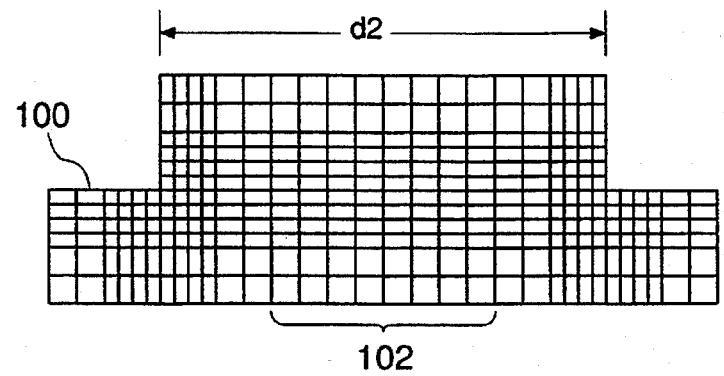
FIG. 7 is an illustration showing a condition where an extension data is added to the result of simulation of FIG. 6.

Next, the discussion will be given for the first embodiment of a simulation method according to the present invention to be implemented by the shown embodiment of the unified process and device simulator according to the invention, with reference to the flowchart of FIG. 2. It should be noted that the following discussion will be given for an application of the first embodiment of the simulation process for MOSFET as the objective device similarly to the foregoing discussion for the conventional system, for the purpose of illustration. As channel lengths of the parameter, 1 μm, 2 μm and 3 μm are selected, and simulation is set to be executed per steps of 1/100 of the overall length of the objective device. One example of the sectional views of the device section obtained through the shown embodiment of the simulation method are illustrated in FIGS. 5, 6 and 7.

Figure 3:
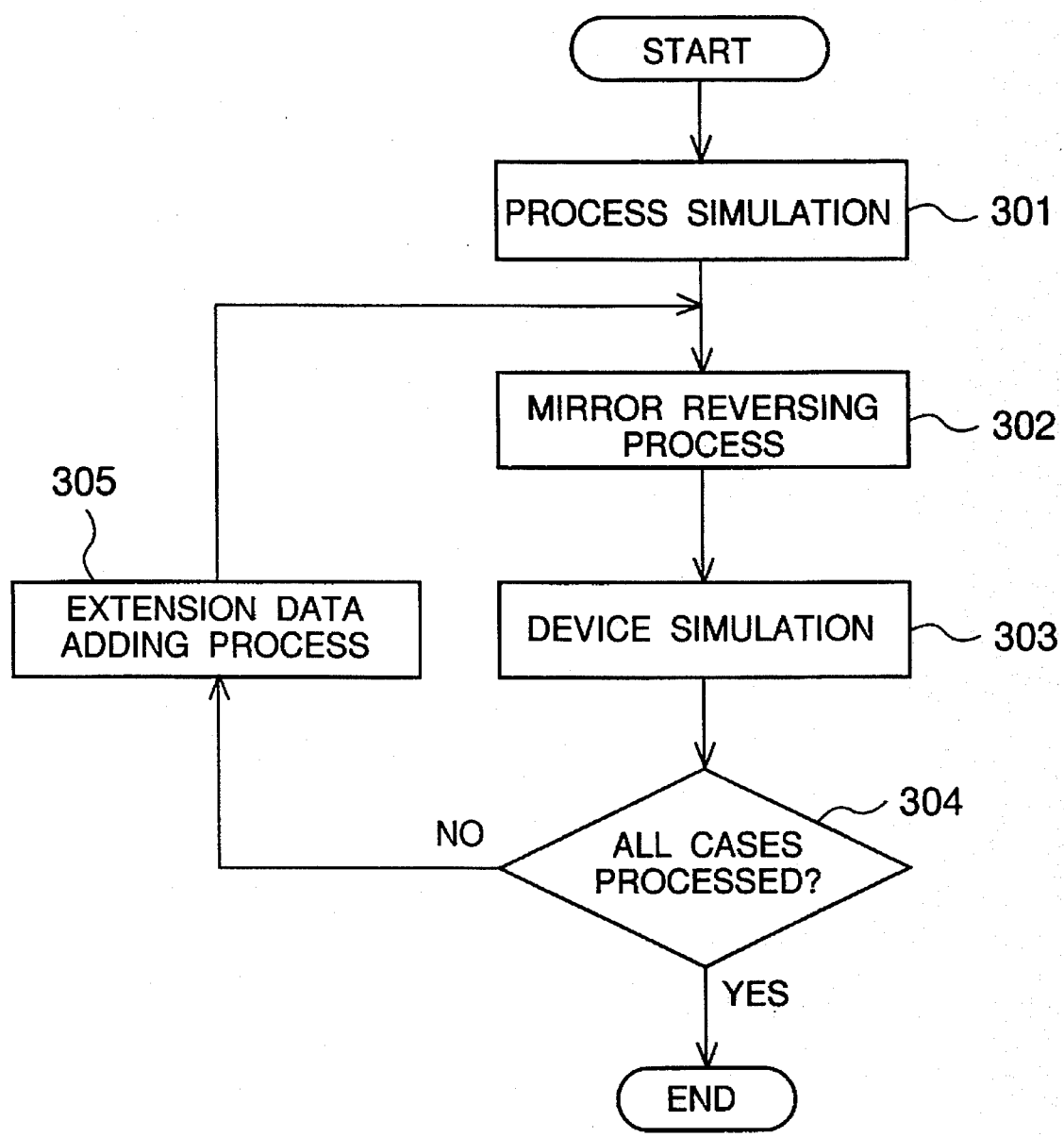
FIG. 3 is a flowchart showing a second embodiment of a simulation method to be implemented by the shown embodiment of the unified process and device simulator.

At first, in the simulation the dimension of the MOSFET corresponding to the channel length d=11 µm, the process simulator 20 performs the process simulation on the basis of the process/mask data 30 for front half, i.e. for 50 steps up to the center line on the section of the objective device (step 201). By this, on the section of the objective device, mesh 100 is set to divide the section into a plurality of segment blocks, as shown in FIG. 3. Then, on the basis of data of respective segment blocks, impurity distribution on the device section is calculated.

Next, the mirror reversal/data processing portion 40 performs the mirror reversing process to form the mirror reversed data symmetric to the simulated data of the front half about the center line 101 and connects the mirror reversed data as the simulation data of the rear half to the simulated data of the front half at the center line (step 202). Namely, by mirror reversing the simulated data for the front half, the simulated data for the rear half is generated without actually performing simulation. The detail of such mirror reversing process is as follows. Initially, a memory space for the overall section is assigned to a region of a memory for data processing. Then, the simulated data of the front half of the section of the objective device is copied to the half of the assigned memory region. For the remaining half of the memory region, the identical simulated data is written in the reversed order, and then connect to the simulated data for the front half. Through these processes, the device structure of the overall MOSFET can be completed. Therefore, an equivalent result to the process simulation for the overall section of the objective device can be obtained.

Next, the device simulator 60 performs device simulation on the basis of the result of process simulation performed by the process simulator 20, the result of the mirror reversing process by the mirror reversal/data processing portion 40 and the analysis condition 70 (step 203).

Here, the supervisor 10 makes judgement whether the simulation is completed with respect to MOSFETs corresponding to all selected channel lengths. At this time, since the simulation for the MOSFET corresponding to the channel length of 1 µm is completed but the simulations for MOSFETs corresponding to channel lengths of 2 µm and 3 µm are not yet performed, the process is returns to the process of the mirror reversal/data processing portion 40 (step 204).

Then, the mirror reversal/data processing portion 40 performs the extension data adding process. In the extension data adding process, the simulation data of the front half at the center line 101 is extended for 1 µm to generate the extension data (see 102 of FIG. 5). The extension data 102 thus generated is connected to the center line of the result of the mirror reversing process of the mirror reversing process (step 205). Through this process, the extended portion corresponding to 1 µm is added. This is equivalent to the result of simulation for MOSFET corresponding to the channel length d2=2 µm. Therefore, the MOSFET structure corresponding to the channel length 2 µm can be completed. Here, it should be appreciated that the impurity distribution in MOSFET is stable at the region in the vicinity of the center portion. Therefore, by generating the extension data by extending the simulation data at the center line 101 in the simulation, the result of simulation for MOSFET corresponding to different channel length can be obtained.

Next, the device simulator 60 performs the device simulation on the basis of the result of process simulation performed by the process simulator 20, the result of the mirror reversing process and the extension data adding process performed by the mirror reversal/data processing portion 40, and the analysis condition 70 (step 203).

Here, the supervisor 10 makes judgement whether the simulation is completed with respect to MOSFETs corresponding to all selected channel lengths. At this time, since the simulation for the MOSFET corresponding to the channel length of 1 µm is completed but the simulation for MOSFET corresponding to channel length of 3 µm are not yet performed, the process is returns to the process of the mirror reversal/data processing portion 40 (step 204).

Then, the mirror reversal/data processing portion 40 performs the extension data adding process. In the extension data adding process, the simulation data of the front half at the center line 101 is extended for 2 µm to generate the extension data (see 102 of FIG. 5). The extension data 102 thus generated is connected to the center line of the result of the mirror reversing process of the mirror reversing process (steps 205, 202). Through this process, the extended portion corresponding to 2 mµ is added. This is equivalent to the result of simulation for MOSFET corresponding to the channel length d=33 µm. Therefore, the MOSFET structure corresponding to the channel length 3 µm can be completed.

Next, the device simulator 60 performs the device simulation on the basis of the result of process simulation performed by the process simulator 20, the result of the mirror reversing process and the extension data adding process performed by the mirror reversal/data processing portion 40, and the analysis condition 70 (step 203).

Through the process set forth above, all simulations for all cases of MOSFETs corresponding to the channel lengths of 1 µm, 2 µm and 3 µm are completed. Therefore, the supervisor 10 makes judgement that all simulations are completed to termination simulation (STEP 204).

As set forth above, with the shown embodiment, the result of the simulation equivalent to that to be obtained through the simulation for the overall section of the objective device, can be obtained through the process simulation for only front half of the section of the objective device. Since the period required for execution of the simulation is proportional to square of number of steps, the simulation period can be shortened to be one fourth of the prior art, in which the simulation is performed through overall section of the objective device. Furthermore, when the simulation has to be performed with respect to a plurality of cases of the channel lengths of the gate as the parameter, as in the shown embodiment, the results of simulation corresponding to respective channel lengths can be obtained through data processing of the result of the actually performed simulation once the process simulation is initially performed for the front half of the section of the objective device. Accordingly, it becomes unnecessary to repeat the simulation for the cycles corresponding to number of cases of the channel lengths, as in the prior art.

As set forth above, when a computer having an operation speed of 30 MIPS (million instructions per second) is employed, a required period for the process simulation for one cycle (one channel length) becomes approximately 15 minutes, and a required period for the device simulation for one cycle becomes approximately 18 minutes, the process period to complete overall simulation will become approximately 58 minutes. This is approximately two third of the conventional method, in which the simulation is performed with respect to the overall section of the objective device, i.e. 99 minutes.

Figure 14:
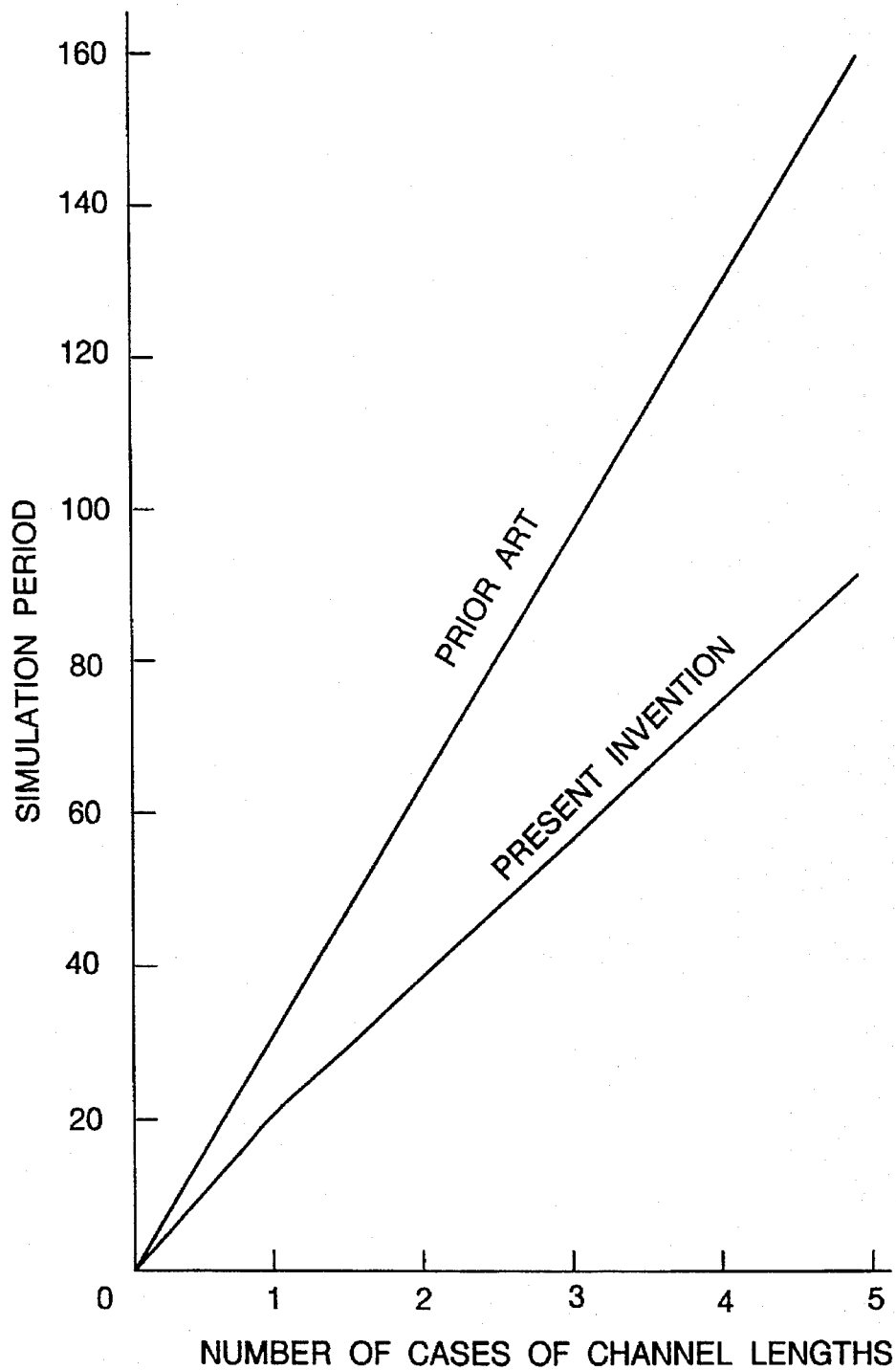
FIG. 14 is an illustration showing a comparison of an operation period required for simulation by the first embodiment of the simulation method according to the present invention and that required in the conventional simulation.
Figure 15:
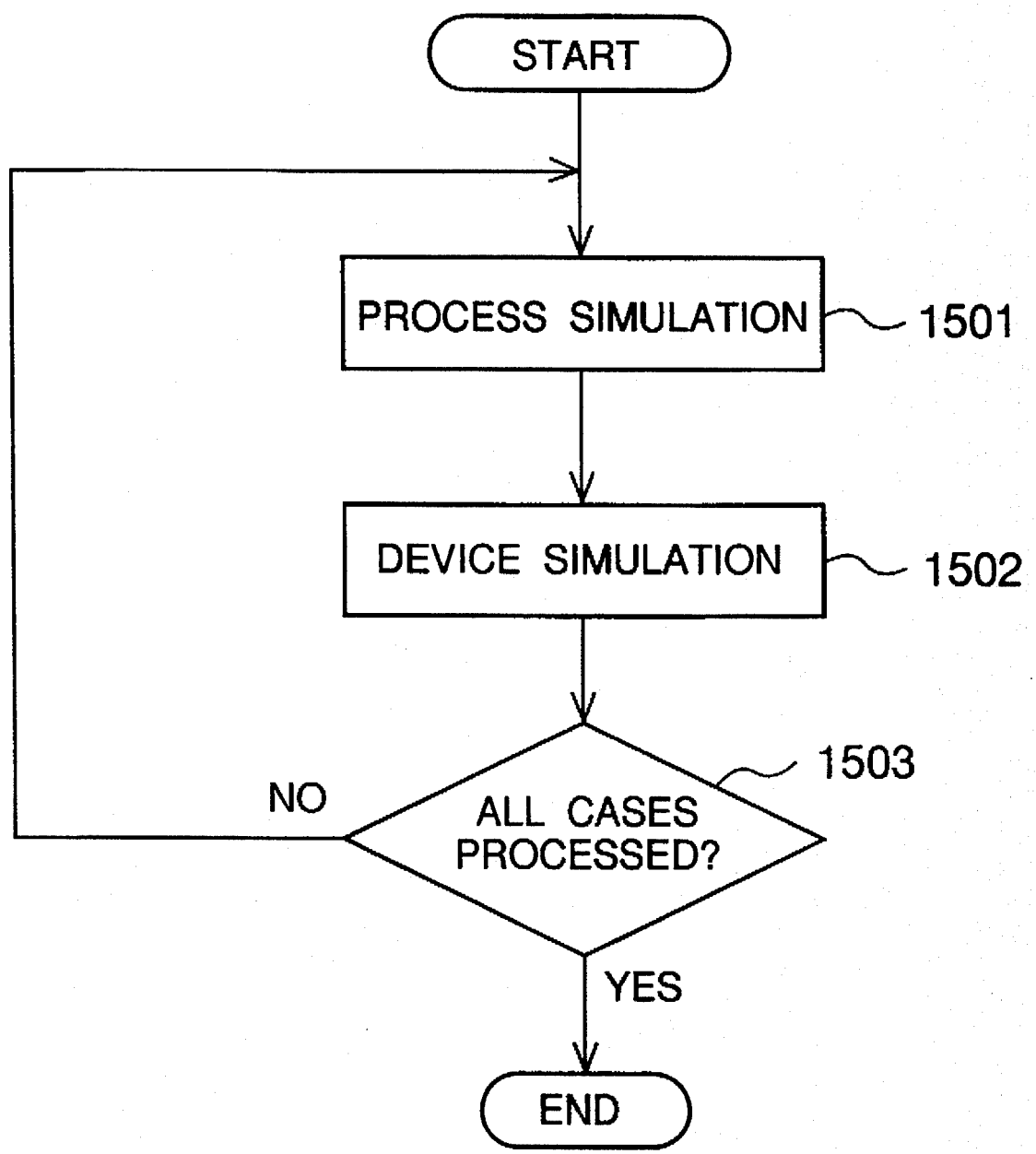
FIG. 15 is a flowchart showing one example of the conventional simulation method.
Figure 16:
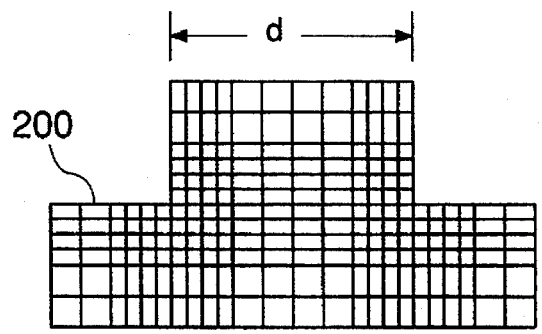
FIG. 16 is a sectional view of the one example of the result of simulation by the prior art.
Figure 17:
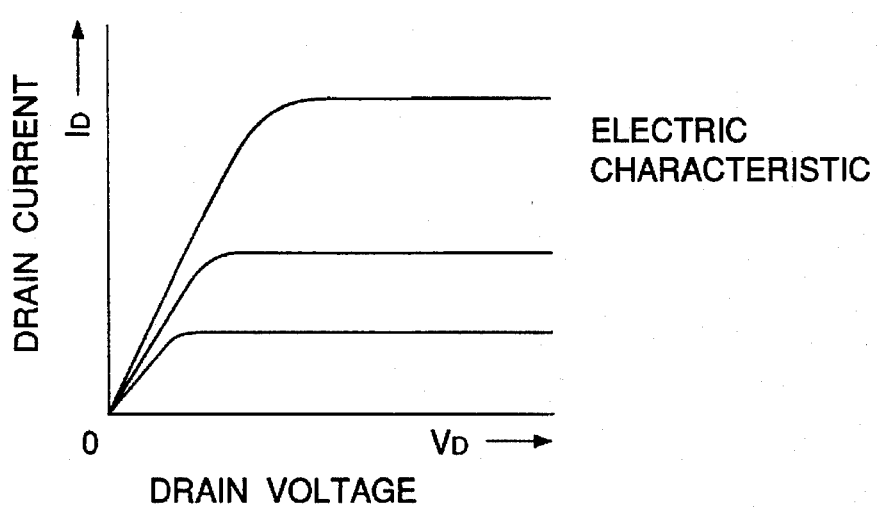
FIG. 17 is a chart showing one example of an electric characteristic of MOSFET obtained by the simulation according to the prior art.

Comparison of the simulation process period in the prior art and the shown embodiment is illustrated in FIG. 14.

With reference to FIG. 14, it becomes clear that the effect to shorten the simulation period becomes greater in the present invention according to increasing of the number of cases of the channel lengths as the parameter.

Figure 8:
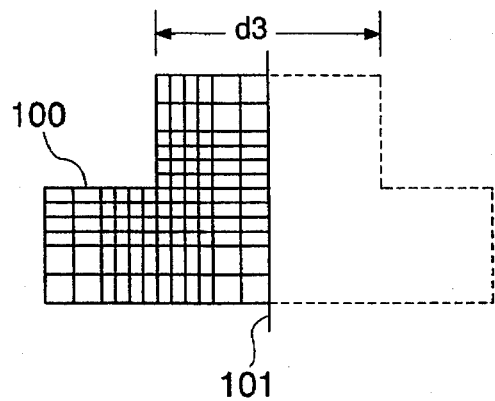
FIG. 8 is a sectional view showing a section of the device representative of the result of simulation according to the second embodiment of the simulation, which section shows the result of simulation for half of the device section.
Figure 9:
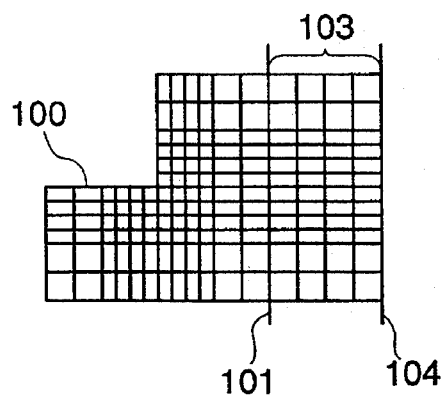
FIG. 9 is an illustration showing a condition where an extension data is added to the result of simulation of FIG. 8.
Figure 10:
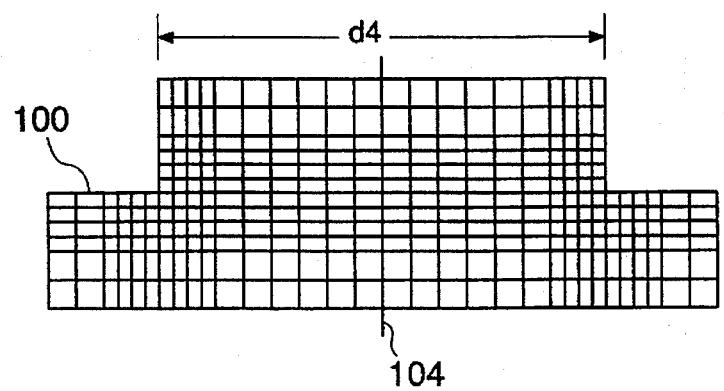
FIG. 10 is an illustration showing a condition where the result of the simulation in FIG. 9 is reversed in mirror fashion and composed.

Next, the second embodiment of the simulation method to be implemented by the unified process and device simulation system will be discussed with reference to the flowchart of FIG. 3. Even in the shown embodiment, the simulation method is applied to MOSFET as the objective device similarly to the first embodiment. As channel lengths of the parameter, 1 µm, 2 µm and 3 µm are selected, and simulation is set to be executed per steps of 1/100 of the overall length of the objective device. One example of the sectional views of the device section obtained through the shown embodiment of the simulation method are illustrated in FIGS. 8, 9 and 10.

In the shown embodiment, the simulation to be performed by the process simulator 20 and the simulation to be performed by the device simulator 60 are similar to those in the above-mentioned first embodiment of the simulation method. In the simulation at the dimension of MOSFET corresponding to the channel length d=41 µm, the mirror reversing process by the mirror reversal/data processing portion 40 also performs the processes similar to the first simulation method. Therefore, discussion for the steps 301, 302 and 303 is neglected to maintain the disclosure clear enough to avoid redundant disclosure and whereby facilitating clear understanding of the invention.

Next, the supervisor 10 makes judgement whether the simulation is completed with respect to MOSFETs corresponding to all selected channel lengths. At this time, since the simulation for the MOSFET corresponding to the channel length of 1 µm is completed but the simulations for MOSFETs corresponding to channel lengths of 2 µm and 3 µm are not yet performed, the process is returns to the process of the mirror reversal/data processing portion 40 (step 304).

Then, the mirror reversal/data processing portion 40 performs the extension data adding process. In the extension data adding process, the simulation data of the front half at the center line 101 is extended for 0.5 µm to generate the extension data (see 103 of FIG. 9). Then, at the end of the extension data extended from the center line 101 of the simulated data obtained through the process simulation, is set as the new center line 104. Thereafter, mirror reversing process is performed for the extended simulation data is performed and the mirror reversed simulation data is connected to the new center line 104 (steps 305 and 302). Through this process, the extended portion corresponding to 1 µm is added. This is equivalent to the result of simulation for MOSFET corresponding to the channel length d=52 µm. Therefore, the MOSFET structure corresponding to the channel length 2 µm can be completed. Thus, the overall device structure of MOSFET can be completed as shown in FIG. 10.

In the similar manner, the extension data of 1 µm is added to the front half of the result of the process simulation, and is unitarily processed with the result of the process simulation by the mirror reversal process to obtain the result of simulation (not shown) equivalent to that obtained through the process simulation for overall section of MOSFET corresponding to the channel length of 3 µm.

Figure 4:
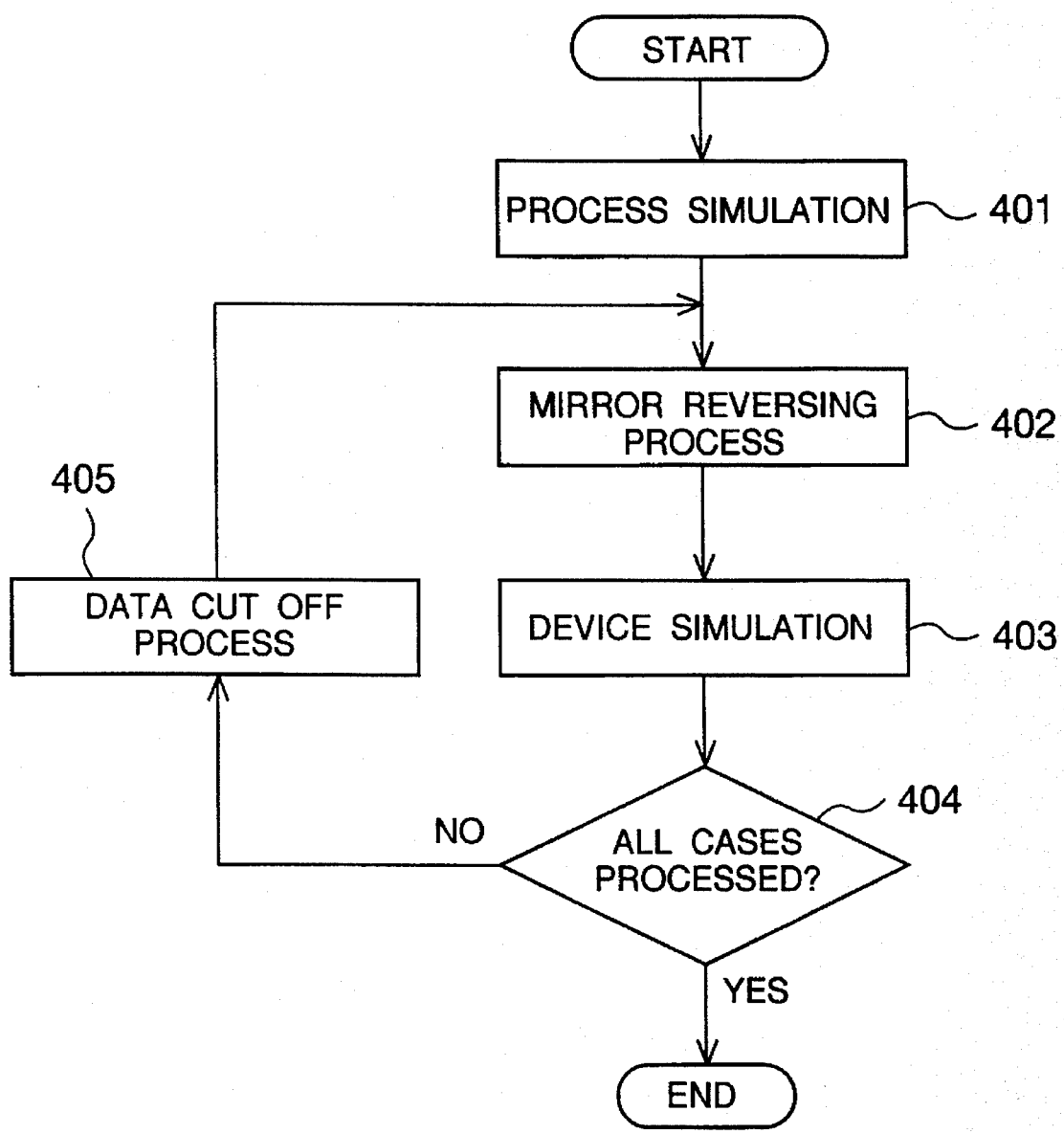
FIG. 4 is a flowchart showing a third embodiment of a simulation method to be implemented by the shown embodiment of the unified process and device simulator.
Figure 11:
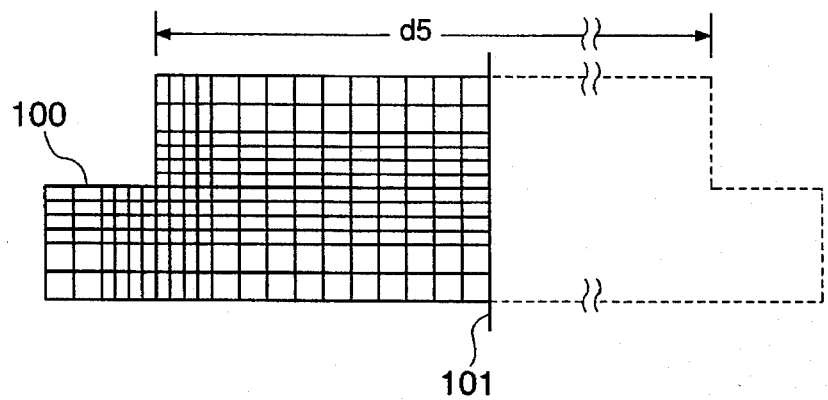
FIG. 11 is a sectional view showing a section of the device representative of the result of simulation according to the third embodiment of the simulation, which section shows the result of simulation for half of the device section.
Figure 12:
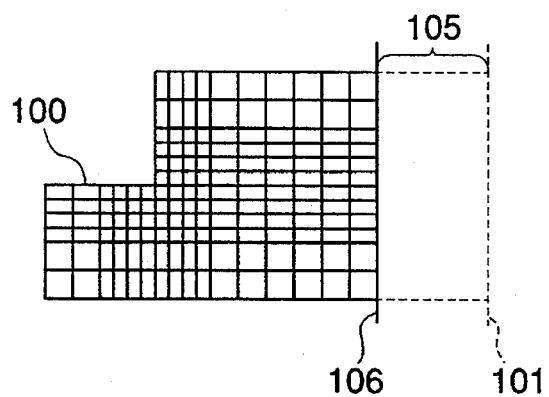
FIG. 12 is an illustration showing a condition where a predetermined data is eliminated from the result of simulation of FIG. 11.
Figure 13:
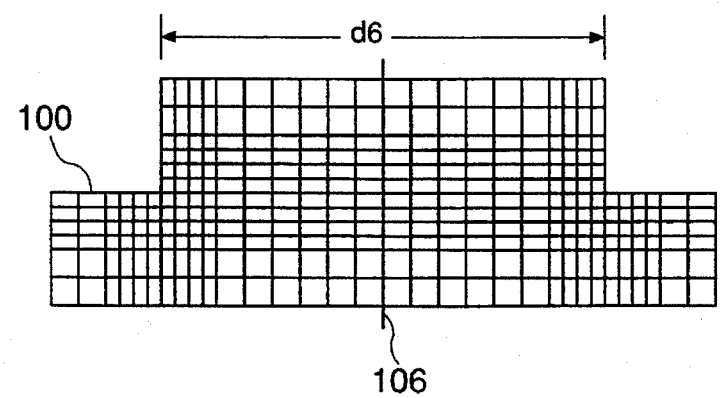
FIG. 13 is an illustration showing a condition where the result of the simulation in FIG. 12 is reversed in mirror fashion and composed.

Next, the third embodiment of the simulation method to be implemented by the unified process and device simulation system will be discussed with reference to the flowchart of FIG. 4. Even in the shown embodiment, the simulation method is applied to MOSFET as the objective device similarly to the first and second embodiments. As channel lengths of the parameter, 1 µm, 2 µm and 3 µm are selected, and simulation is set to be executed per steps of 1/100 of the overall length of the objective device. One example of the sectional views of the device section obtained through the shown embodiment of the simulation method are illustrated in FIGS. 11, 12 and 13. In the shown embodiment, the simulation to be performed by the process simulator 20 and the simulation to be performed by the device simulator 60 are similar to those in the above-mentioned first embodiment of the simulation method.

Initially, in the simulation at the dimension of MOSFET corresponding to the channel length d6=3 µm, the process simulator 20 performs the process simulation on the basis of the process/mask data 30 for front half, i.e. for 50 steps up to the center line on the section of the objective device (step 401). By this, on the section of the objective device, mesh 100 is set to divide the section into a plurality of segment blocks, as shown in FIG. 11. Then, on the basis of data of respective segment blocks, impurity distribution on the device section is calculated.

Next, the mirror reversal/data processing portion 40 performs the mirror reversing process to form the mirror reversed data symmetric to the simulated data of the front half about the center line 101 and connects the mirror reversed data as the simulation data of the rear half to the simulated data of the front half at the center line (step 402). Through these processes, the device structure of the overall MOSFET illustrated in FIG. 4 can be completed. Therefore, an equivalent result to the process simulation for the overall section of the objective device can be obtained.

Next, the device simulator 60 performs device simulation on the basis of the result of process simulation performed by the process simulator 20, the result of the mirror reversing process by the mirror reversal/data processing portion 40 and the analysis condition 70 (step 403).

Here, the supervisor 10 makes judgement whether the simulation is completed with respect to MOSFETs corresponding to all selected channel lengths. At this time, since the simulation for the MOSFET corresponding to the channel length of 3 µm is completed but the simulations for MOSFETs corresponding to channel lengths of 2 µm and 1 µm are not yet performed, the process is returns to the process of the mirror reversal/data processing portion 40 (step 404).

Here, the mirror reversal/data processing portion 40 performs different process to those performed in the first and second embodiments. Namely, instead of adding the extension data, the shown embodiment processes the result of the process simulation by the process simulator for the front half of the section of the MOSFET, by cutting off or remove the simulation data for 0.5 µm from the center line 101 (see 105 of FIG. 12) through the data cut off process. The end after removal of the segment corresponding to 0.5 µm length is set as new center line 106. Subsequently, the mirror reversing process is performed with respect to the new center line to form the mirror reversed data to connect the mirror reversed data to the simulated data which is partially cut off through the data cut off process, at the new center line 106 (steps 405 and 402.) By this, the data segment corresponding to 1 µm is removed from the result of process simulation by the process simulator 20 for MOSFET corresponding to the channel length 3 µm. The result thus obtained is equivalent to the result of process simulation for overall section of MOSFET corresponding to the channel length d7=2 μm. The completed overall device structure of MOSFET corresponding to the channel length of 2 μm is illustrated in FIG. 13.

It should be appreciated that the impurity distribution in MOSFET is stable at the region in the vicinity of the center portion. Therefore, by removing the data segment from simulation data at the center line 101 in the simulation, the result of simulation for MOSFET corresponding to different channel length can be obtained.

Subsequently, the device simulation is performed by the device simulator 60 in the same manner to that set forth above (step 404). Thereafter, the supervisor 10 again checks whether simulations have been completed for all cases of MOSFET corresponding to all of set channel lengths or not. Currently, since the simulation for the case of MOSFET corresponding to the channel length of 1 μm is not yet completed, the process is returned to the mirror reversal/data processing portion 40 (step 404). Then, the data cut off process becomes active to process the result of the process simulation by the process simulator for the front half of the section of the MOSFET, by cutting off or remove the simulation data for 1 μm from the center line 101, and subsequently, the mirror reversing process is performed with respect to the new center line to form the mirror reversed data to connect the mirror reversed data to the simulated data which is partially cut off through the data cut off process, at the new center line. By this, the data segment corresponding to 2 μm is removed from the result of process simulation by the process simulator 20 for MOSFET corresponding to the channel length 3 μm. The result thus obtained is equivalent to the result of process simulation for overall section of MOSFET corresponding to the channel length 1 μm.

As set forth above, even in the second and third embodiments of the simulation methods, the result of the simulation equivalent to that to be obtained through the simulation for the overall section of the objective device, can be obtained through the process simulation for only front half of the section of the objective device. Since the period required for execution of the simulation is proportional to square of number of steps, the simulation period can be shortened to be one fourth of the prior art, in which the simulation is performed through overall section of the objective device. Furthermore, when the simulation has to be performed with respect to a plurality of cases of the channel lengths of the gate as the parameter, as in the shown embodiment, the results of simulation corresponding to respective channel lengths can be obtained through data processing of the result of the actually performed simulation once the process simulation is initially performed for the front half of the section of the objective device. Accordingly, it becomes unnecessary to repeat the simulation for the cycles corresponding to number of cases of the channel lengths, as in the prior art.

While the present invention has been disclosed in terms of specific embodiments, various modifications, additions, eliminations of details should be obvious to those skilled in the art. Therefore, the present invention should be understood to include all possible embodiments which can be embodied without departing from the principle of the invention set forth in appended claims.

What is claimed is:

1. A unified process and device simulation system unitarily performing simulation for a process design and a device design of a semiconductor device, comprising:

a process simulator performing a process simulation for one of a pair of regions of the semiconductor device, said regions being symmetric in configuration and structure about a center line which is perpendicular to a direction about which the simulation is carried out, and generating a first simulation data;

mirror reversal processing means for performing a mirror reversing process for establishing a mirror data of said first simulation data symmetric about said center line;

extension data adding means for generating an extension data by extending the first simulation data and for adding said extension data between said first simulation data and said mirror data to generate a second data equivalent to a process simulation data obtained through the process simulation for an entire region of the semiconductor device; and a device simulator for performing a device simulation with respect to said second data on the basis of a predetermined analysis condition.

2. A unified process and device simulation system as set forth in claim 1, wherein said mirror reversal processing means performs reversing process by copying said first simulation data to a memory region for data processing and reversing the order of the copied first simulation data for establishing said mirror data and generates said second data by coupling said mirror data to said first simulation data at said center line.

3. A unified process and device simulation system as set forth in claim 1, wherein said extension data adding means generates said extension data by extending the first simulation data corresponding to the center line of said semiconductor device to a predetermined length.

4. A unified process and device simulation system unitarily performing simulation for a process design and a device design of a semiconductor device, comprising:

process simulator performing a process simulation for one of a pair of regions of the semiconductor device, said regions being symmetric in configuration and structure about a center line which is perpendicular to a direction about which the simulation is carried out, and generating a first simulation data;

extension data adding means for generating an extension data by extending the first simulation data to a predetermined length and for adding said extension data to said first simulation data;

mirror reversal processing means for performing a mirror reversing process for establishing a mirror data of said first simulation data and said extension data symmetric about the center line and connecting said mirror data to said first simulation data and said extension data to generate a second data equivalent to a process simulation data obtained through the process simulation for an entire region of the semiconductor device; and a device simulator for performing a device simulation with respect to said second data on the basis of a predetermined analysis condition.

5. A unified process and device simulation system unitarily performing simulation for a process design and a device design of a semiconductor device, comprising:

a process simulator performing a process simulation for one of a pair of regions of the semiconductor device, said regions being symmetric in configuration and structure about a center line which is perpendicular to a direction about which the simulation is carried out, and generating a first simulation data;

mirror reversal processing means for performing a mirror reversing process for establishing a mirror data of said first simulation data symmetric about said center line;

data cutting off means for cutting off a predetermined length of said first simulation data from the center line, and for connecting said first simulation data from which said predetermined length is cut off and said mirror data to generate a second data equivalent to a process simulation data obtained through the process simulation for an entire region of the semiconductor device; and a device simulator for performing a device simulation with respect to said second data on the basis of a predetermined analysis condition.

6. A unified process and device simulation system unitarily performing simulation for a process design and a device design of a semiconductor device, comprising:

a process simulator performing a process simulation for one of a pair of regions of the semiconductor device, said regions being symmetric in configuration and structure about a center line which is perpendicular to a direction about which the simulation is carried out, and generating a first simulation data;

data cutting off means for cutting off a predetermined length of said first simulation data from the center line;

mirror reversal processing means for performing a mirror reversing process for establishing a mirror data with respect to said first simulation data from which said predetermined length is cut off symmetric about said center line and connecting said mirror data to said first simulation data from which said predetermined length is cut off to generate a second data equivalent to a process simulation data obtained through the process simulation for an entire region of the semiconductor device; and a device simulator for performing a device simulation with respect to said second data on the basis of a predetermined analysis condition.

7. A method for performing process and device composite simulation for unitarily performing simulation for a process design and a device design of a semiconductor device by an electronic computer, comprising the steps of:

performing a process simulation for one of a pair of regions of the semiconductor device, said regions being symmetric in configuration and structure about a center line which extends perpendicular to a direction about which the simulation is carried out, and generating a first simulation data;

performing a mirror reversing process for establishing a mirror data of said first simulation data symmetric about said center line and connecting said mirror data to said first simulation data at the center line in order to generate a second data;

extending the first simulation data at said center line in the direction about which the simulation is carried out; and performing a device simulation with respect to said second data on the basis of a predetermined analysis condition.

8. A simulation method as set forth in claim 7, wherein said mirror reversal process is performed by copying said first simulation data to a memory region for data processing and reversing the order of the copied first simulation data for establishing said mirror data and said second data is generated by coupling said mirror data to said first simulation data at said center line.

9. A simulation method as set forth in claim 7, wherein said extending step generates extension data by extending the first simulation data to a predetermined length.

10. A simulation method as set forth in claim 7, wherein said extending step is executed prior to the step of performing said mirror reversing process.

11. A simulation method as set forth in claim 7, further comprising the step of cutting off a predetermined length of said first simulation data from the center line, and connecting said first simulation data from which said predetermined length is cut off and said mirror data to generate said second data.

12. A simulation method as set forth in claim 7, further comprising the step of cutting off a predetermined length of said first simulation data from the center line prior to said step of performing said mirror reversing process.

* * * * *